United States Patent
Zhou et al.

(10) Patent No.: US 9,728,454 B1
(45) Date of Patent: Aug. 8, 2017

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Zhibiao Zhou, Singapore (SG); Ding-Lung Chen, Singapore (SG); Xing Hua Zhang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/242,611

(22) Filed: Aug. 22, 2016

(30) Foreign Application Priority Data

Jul. 7, 2016 (TW) .............................. 105121505 A

(51) Int. Cl.
| | |
|---|---|
| H01L 21/768 | (2006.01) |
| H01L 23/522 | (2006.01) |
| H01L 23/528 | (2006.01) |
| H01L 21/8234 | (2006.01) |

(52) U.S. Cl.
CPC .. *H01L 21/76895* (2013.01); *H01L 21/76816* (2013.01); *H01L 21/823431* (2013.01); *H01L 21/823475* (2013.01); *H01L 23/528* (2013.01); *H01L 23/5221* (2013.01)

(58) Field of Classification Search
CPC ....................... H01L 21/76895; H01L 21/0334
See application file for complete search history.

(56) References Cited

U.S. PATENT DOCUMENTS

| | | | | | |
|---|---|---|---|---|---|
| 6,071,799 | A | * | 6/2000 | Park ................. | H01L 21/76802 257/E21.507 |
| 6,083,827 | A | * | 7/2000 | Lin .................... | H01L 21/76895 257/E21.304 |
| 6,174,803 | B1 | * | 1/2001 | Harvey ............. | H01L 21/76895 257/758 |
| 6,329,720 | B1 | * | 12/2001 | Li ..................... | H01L 21/76895 257/383 |
| 6,710,412 | B2 | | 3/2004 | Tsukamoto | |
| 6,797,611 | B1 | * | 9/2004 | Wu ................... | H01L 21/76816 257/774 |
| 6,822,300 | B2 | | 11/2004 | Nii | |
| 6,838,695 | B2 | | 1/2005 | Doris | |
| 6,858,486 | B2 | | 2/2005 | Chatterjee | |
| 9,147,576 | B2 | | 9/2015 | Horak | |
| 9,461,143 | B2 | * | 10/2016 | Pethe ............... | H01L 21/76895 |
| 9,515,148 | B2 | * | 12/2016 | Li ..................... | H01L 29/40 |

(Continued)

*Primary Examiner* — Benjamin Sandvik
(74) *Attorney, Agent, or Firm* — Winston Hsu

(57) ABSTRACT

The present invention provides a semiconductor structure, includes a substrate, a dielectric layer disposed on the substrate, a first gate structure and a second gate structure disposed in the dielectric layer, a hard mask disposed in the dielectric layer, where the hard mask covers a sidewall of the first gate structure, and covers the second gate structure, and a contact structure disposed in the dielectric layer. The contact structure at least crosses over the hard mask. The contact structure includes a first contact portion and a second contact portion. The first contact portion contacts the first gate structure directly, the second contact portion contacts the substrate directly, and the hard mask is disposed between the first contact portion and the second contact portion.

19 Claims, 17 Drawing Sheets

(56) References Cited

U.S. PATENT DOCUMENTS

| | | | |
|---|---|---|---|
| 2006/0263985 A1* | 11/2006 | Kang | H01L 21/823814 438/275 |
| 2006/0264057 A1* | 11/2006 | Manning | H01L 27/105 438/740 |
| 2016/0013198 A1* | 1/2016 | Liu | H01L 27/11524 257/322 |

* cited by examiner

SEMICONDUCTOR STRUCTURE AND MANUFACTURING METHOD THEREOF

BACKGROUND OF THE INVENTION

1. Field of the Invention

Embodiments of the invention generally relate to a semiconductor device, and more particularly to structures, semiconductor devices, and fabrication of semiconductor devices with bridged local interconnects.

2. Description of the Prior Art

In semiconductor device fabrication, various semiconductor components should be electrically connected to other semiconductor components. Depending upon layout of semiconductor components within the semiconductor device, it may be challenging to electrically connect the desired components, especially if the components to be connected are located near each other or if other semiconductor components separate the components to be connected.

SUMMARY OF THE INVENTION

The present invention provides a semiconductor structure, includes a substrate, a dielectric layer disposed on the substrate, a first gate structure and a second gate structure disposed in the dielectric layer, a hard mask disposed in the dielectric layer, and the hard mask covers a sidewall of the first gate structure, and covers the second gate structure, and a contact structure disposed in the dielectric layer, the contact structure at least crosses over the hard mask, and the contact structure comprises a first contact region and a second contact region, wherein the first contact region directly contacts the first gate structure, the second contact region directly contacts the substrate, the hard mask disposed between the first contact region and the second contact region.

The present invention further provides a method for forming a semiconductor structure, comprising the following steps: firstly, a substrate is provided, next, a dielectric layer is formed on the substrate, a first gate structure and a second gate structure are formed on the dielectric layer, afterwards, a hard mask is formed in the dielectric layer, covering the first gate structure and the second gate structure, a first etching process is then performed, to remove parts of the hard mask, wherein after the first etching process is performed, the hard mask covers a sidewall of the first gate structure, and covers the second gate structure, and a contact structure is formed in the dielectric layer, the contact structure at least crosses over the hard mask, and the contact structure comprises a first contact region and a second contact region, wherein the first contact region directly contacts the first gate structure, the second contact region directly contacts the substrate, the hard mask is disposed between the first contact region and the second contact region.

A key feature of the present invention is that one terminal of the bridged local interconnect is electrically contacted to a specific gate structure, and the bridged local interconnect crosses over at least one adjacent device, and another terminal of the bridged local interconnect is electrically contacted to other devices. In practice, the bridged local interconnect can electrically contact to some adjacent devices, and it can be electrically isolated with other adjacent devices. So the bridged local interconnect of the present invention can applied in various circuit layout patterns.

Using the method provided by the present invention, the bridged local interconnects can be formed simply and with low cost.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6A illustrate a forming method of a semiconductor structure according to a first embodiment of the present invention, wherein:

FIG. 1 shows the schematic diagram of the semiconductor structure, including two gate structures and a dielectric layer are formed on a substrate;

FIG. 2 shows the schematic diagram of the semiconductor structure after a first etching process is performed;

FIG. 3 shows the schematic diagram of the semiconductor structure after a dielectric layer is formed;

FIG. 4 shows the schematic diagram of the semiconductor structure after a second etching process is performed;

FIG. 5 shows the schematic diagram of the semiconductor structure after a third etching process is performed;

FIG. 6 shows the schematic diagram of the semiconductor structure after a conductive layer is formed;

FIG. 6A shows the top view diagram of the semiconductor structure of FIG. 6.

FIGS. 7-10 illustrate a forming method of a semiconductor structure according to a first embodiment of the present invention, wherein:

FIG. 7 shows the schematic diagram of the semiconductor structure, including two gate structures and a dielectric layer are formed on a substrate, and a hard mask is formed on the dielectric layer formed;

FIG. 8 shows the schematic diagram of the semiconductor structure after a dielectric layer is formed;

FIG. 9 shows the schematic diagram of the semiconductor structure after a fourth etching process is performed;

FIG. 10 shows the schematic diagram of the semiconductor structure after a conductive layer is formed.

DETAILED DESCRIPTION

Figure 1:
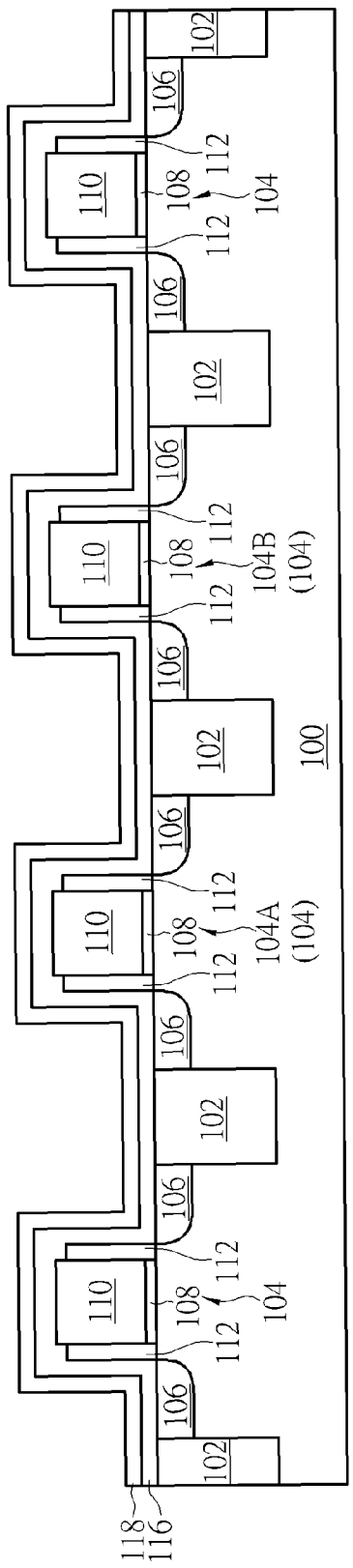

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIGS. 1-6 illustrate a forming method of a semiconductor device according to a first embodiment of the present invention. First of all, a substrate 100 is provided, at least two gate structures 104 are formed on the substrate 100, here the two gate structures are labeled as a first gate structure 104A and a second gate structure 104B respectively. The substrate 100 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. Moreover, at least one shallow trench isolation (STI) 102 may be previously formed in the substrate 100 to identify each active area.

Typical integrated circuits (e.g. semiconductor devices, semiconductor structures, etc.) may be divided into a plurality of active areas and a plurality of non-active areas. The active areas may include finFET devices (e.g. pFET, nFET, etc.). Each active area may have a different pattern density, different number of finFET devices, different type of finFET device(s), etc.

Each gate structure 104 includes a gate dielectric layer 108 and a gate conductive layer 110. The material of the gate dielectric layer 108 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_{1-x}O_3$, PZT), barium strontium titanate ($BaxSr_{1-x}TiO_3$, BST) or a combination thereof. The material of the gate conductive layer 110 may include undoped polysilicon, heavily doped polysilicon, or one or a plurality of metal layers such as a work function metal layer, a barrier layer and a low-resistance metal layer, etc. But the present invention is not limited thereto, and the materials mentioned above can be adjusted according to actual requirements.

In addition, the present invention further comprises a plurality of the spacer 112, disposed on two sides of the gate structure 104 respectively. The material of the spacer 112 includes such as silicon nitride or silicon oxide. Afterwards, a contact etch stop layer (CESL) 116 is formed on the substrate 100, covers each gate structure 104 and each spacer 112. The CESL 116 may be a single layer structure or a multiple layer structure, thereby providing required compressive stress or tensile stress to the gate structure 104, but not limited thereto. In another embodiment, the steps for forming the CESL can also be omitted. Besides, at least two S/D regions 106 are formed in the substrate 100 on two sides of the spacer 112 respectively. Also, in another embodiment, the present invention may include forming a light doped drain (LDD) region (not shown in the drawings) in the substrate 100 before the spacer 112 is formed according to practical requirements.

After the CESL 116 is formed, a hard mask 118 is then formed, and conformally covers the CESL 116. The material of the hard mask 118 may include dielectric materials or conductive materials (such as metals), the present invention is not limited thereto. It is noteworthy that, in some case, if the CESL 116 is not formed, the hard mask 118 should include insulating materials, thereby electrically isolating contact structures (formed in the following steps) and the gate structures. In addition, the hard mask 118 and CESL 116 preferably include different materials. In this way, the hard mask 118 and CESL 116 will have etching selectivity (they have different etching rate under a same etchant) in the following etching processes.

Figure 1A:
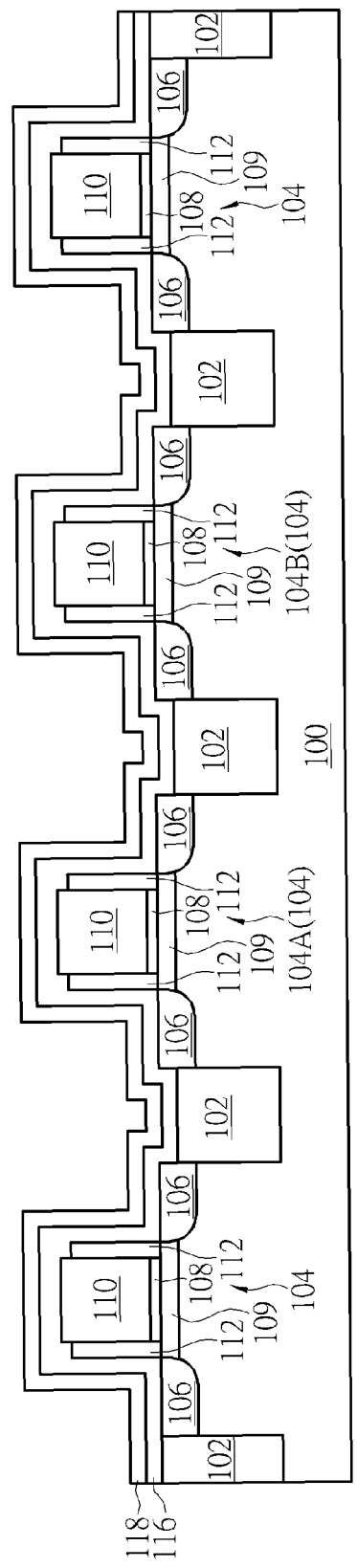
FIG. 1A shows the schematic diagram of the semiconductor structure according to another embodiment of the present invention.

FIG. 1A shows the schematic diagram of the semiconductor structure according to another embodiment of the present invention. The difference between this embodiment and the embodiment mentioned above is, this embodiment further comprises a plurality of the fin structures 109 disposed on the substrate 100, the gate structures 104 cross over each fin structure 109, and this should also be within the scope of the present invention. However, to simplify the description, the following paragraphs still take the semiconductor structure shown in FIG. 1 as an example.

Figure 2:
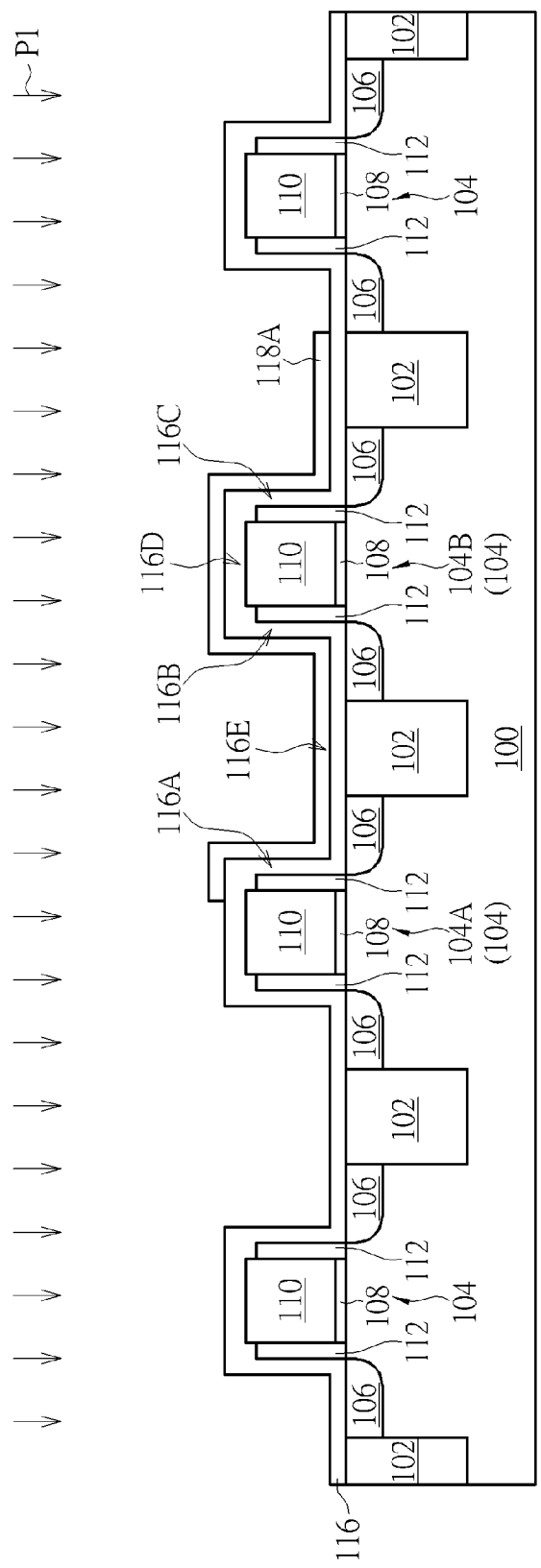

As shown in FIG. 2, a first etching process P1 is performed, to remove parts of the hard mask 118. It is noteworthy that after the first etching process P1 is performed, the hard mask 118 is not disposed right above the first gate structure 104A, but it covers right above the second gate structure 104B, and also covers the region between the first gate structure 104A and the second gate structure 104B. In this embodiment, the rest hard mask is defined as the hard mask 118A, the hard mask 118A has a battlements-shaped profile, the hard mask 118A covers a sidewall 116A, a sidewall 116B and a sidewall 116C of the CESL 116, and also covers two top surfaces 116D, 116E of the CESL 116. The sidewall 116A covers a sidewall of the first gate structure 104A; the sidewalls 116B and 116C cover the two sidewalls of the second gate structure 104B respectively; the top surface 116D covers a top surface of the second gate structure 104B; and the top surface 116E covers the substrate 100 and the STI 102 between the first gate structure 104A and the second gate structure 104B. In another embodiment of the present invention, if the CESL 116 is not formed, the hard mask 118A at least covers a sidewall of the first gate structure 104A, two sidewalls and a top surface of the second gate structure 104B, and also covers the substrate 100 and the STI 102 that is disposed between the first gate structure 104A and the second gate structure 104B.

Figure 3:
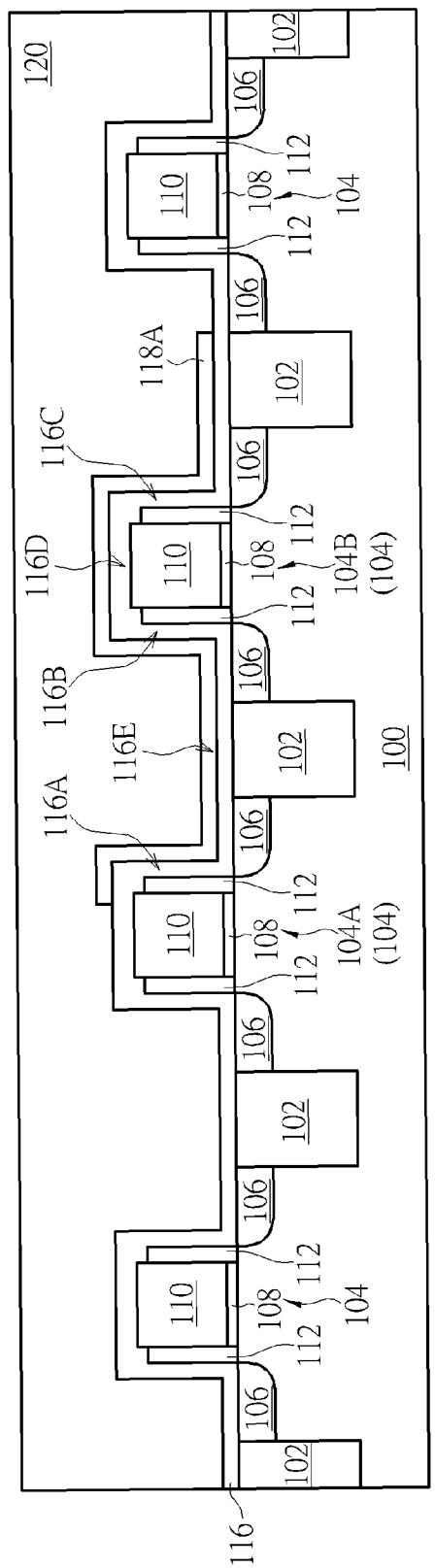
Figure 4:
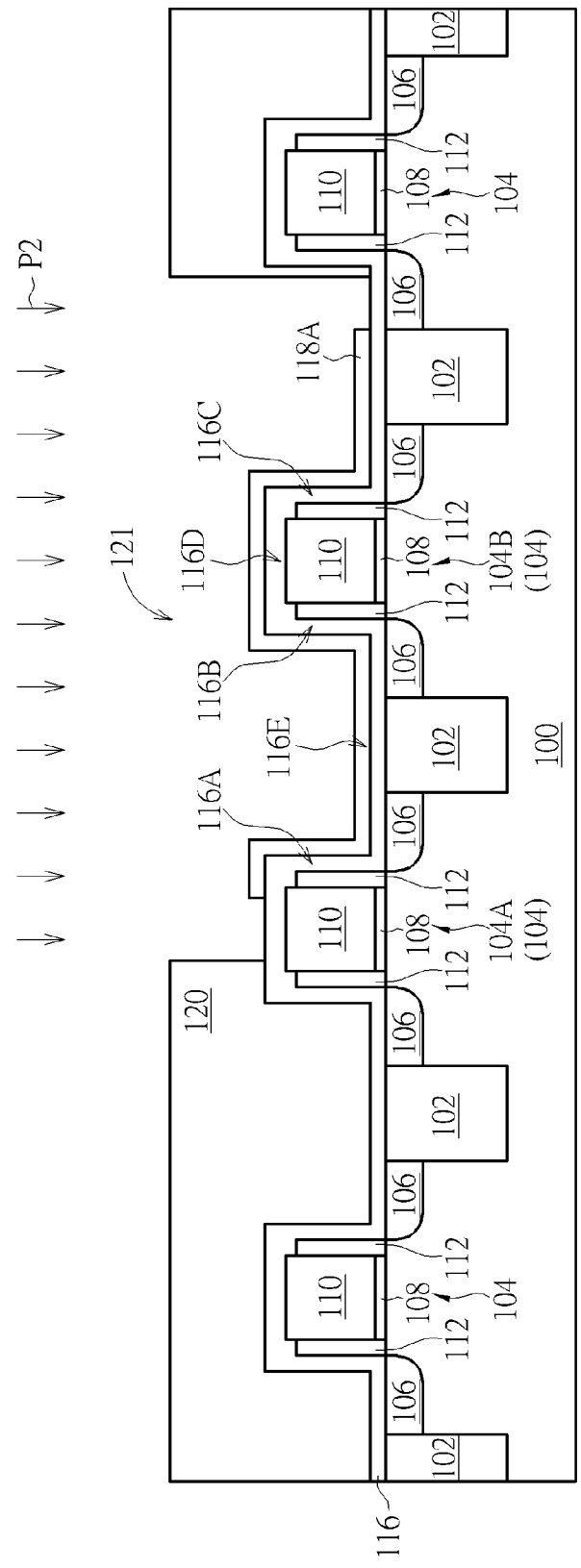

Next, as shown in FIG. 3, a dielectric layer 120, such as a silicon oxide layer is formed, and covers the hard mask 118A and CESL 116. Afterwards, as shown in FIG. 4, using a suitable method (such as a photolithography process) to form a patterned photoresist layer (not shown) on the dielectric layer 120, and a second etching process P2 is then performed, to remove parts of the dielectric layer 120, and a recess 121 is formed in the dielectric layer 120. It is noteworthy that the hard mask 118A disposed in the recess 121 is entirely exposed, and parts of the CESL 116 in the recess 121 is also exposed.

Figure 5:
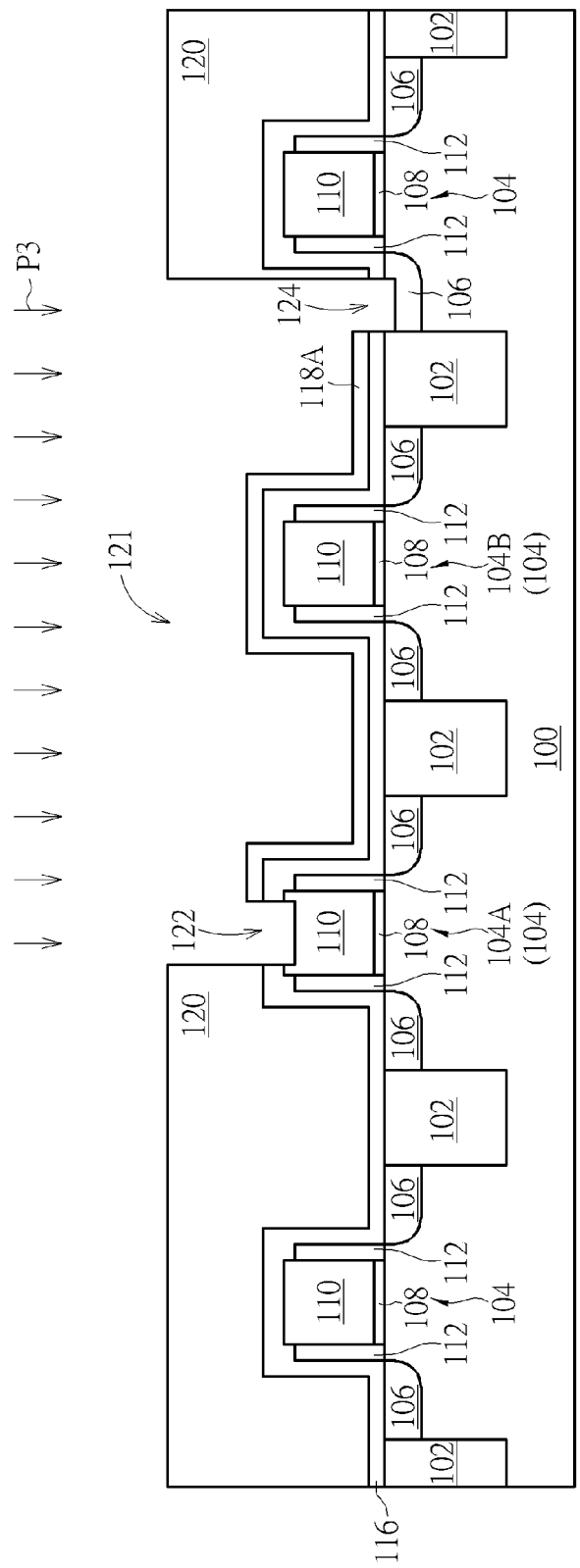
Figure 5A:
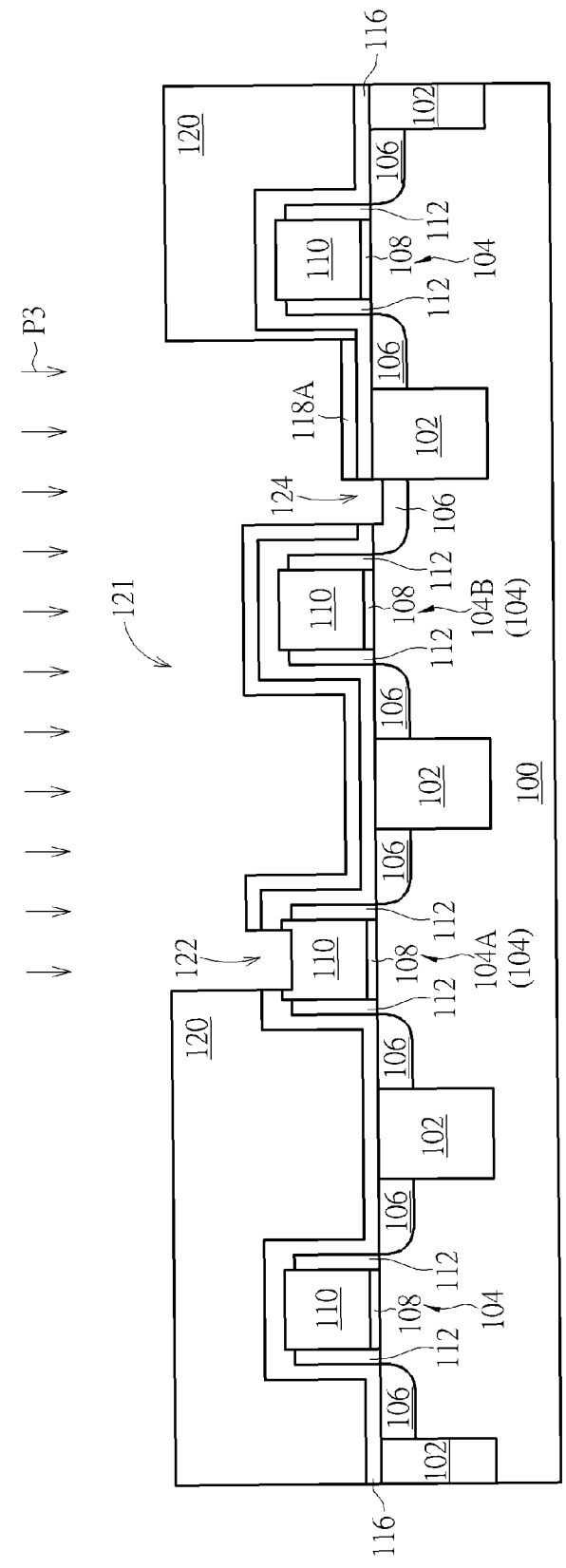
FIG. 5A shows the schematic diagram of the semiconductor structure according to another embodiment of the present invention.
Figure 5B:
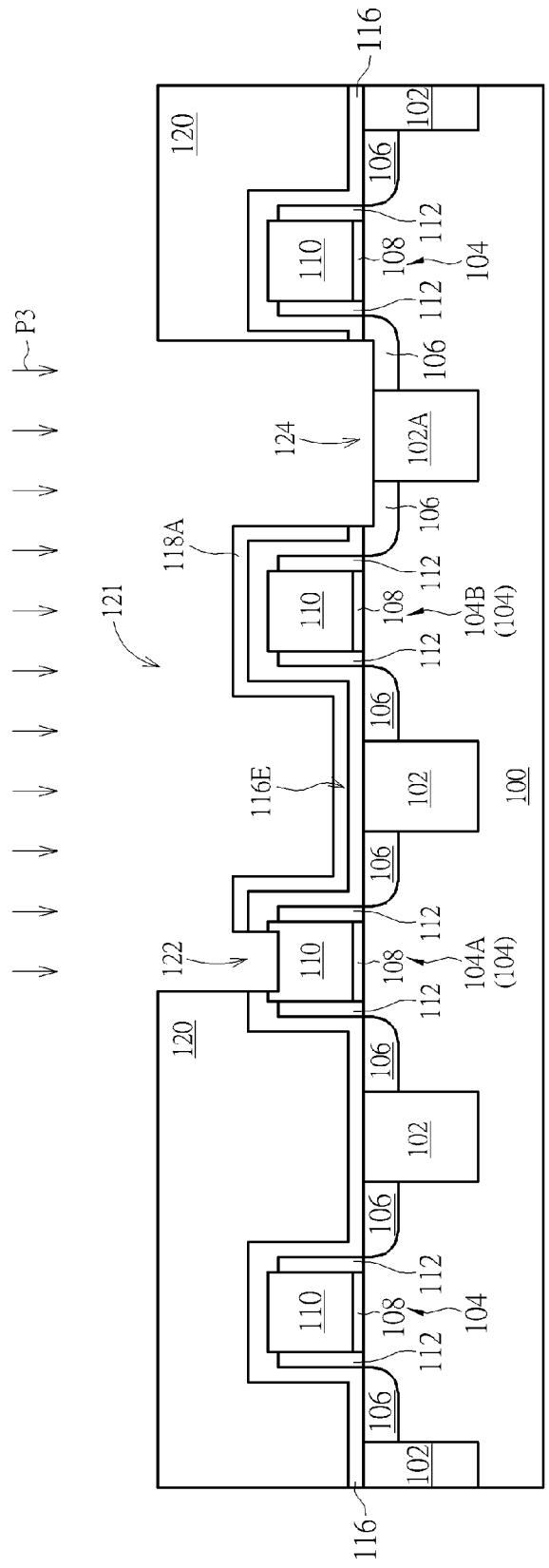
FIG. 5B shows the schematic diagram of the semiconductor structure according to another embodiment of the present invention.

As shown in FIG. 5, a third etching process P3 is performed, to remove the CESL 116 that is not covered by the dielectric layer 120 and the hard mask 118A in the recess 121. After the CESL 116 is partially removed, a first recess 122 and a second recess 124 are formed, the first recess 122 expose a top surface of the first gate structure 104A, and the second recess 124 exposes the substrate 100. It is noteworthy that, in this embodiment, the second recess 124 is disposed beside the second gate structure 104B and exposes the substrate 100, but a STI 102 may be disposed between the second recess 124 and the second gate structure 104B. In another embodiment of the present invention, the second recess 124 exposes the S/D region 106 that is disposed beside the second gate structure 104B. In other words, there is not any STI disposed between the second recess 124 and the second gate structure 104B. Please refer to FIG. 5A, which shows the cross section diagram of the semiconductor structure according to another preferred embodiment of the present invention. Orin another embodiment, the second recess 124 exposes the STI 102 that is disposed beside the second gate structure 104B. Please refer to FIG. 5B, which shows the cross section diagram of the semiconductor structure according to another preferred embodiment of the present invention. Those cases should also be within the scope of the present invention.

Figure 6:
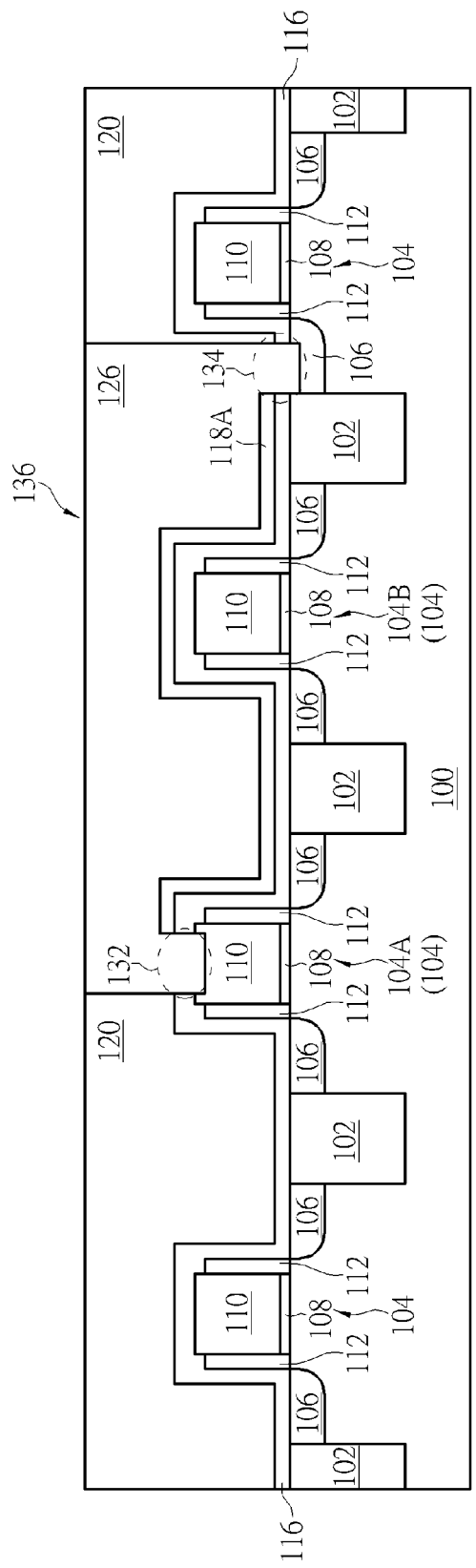

Next, as shown in FIG. 6, a conductive layer 126 is formed in the recess 121, and a planarization process, such as a chemical mechanical polishing (CMP) is then performed, to remove the extra conductive layer 126. The conductive layer 126 fills up the recess 121, and the conductive layer 126 includes materials with low resistance and superior gap-filling characteristic, such as tungsten (W), aluminum (Al), titanium aluminide (TiAl), or titanium aluminum oxide (TiAlO), but not limited to this. Furthermore, before the conductive layer 126 is filled, a liner (not shown) can be selectively formed in the recess 121, the material of the liner includes such as titanium nitride (TiN) or tantalum nitride (TaN), but not limited thereto.

Figure 6A:
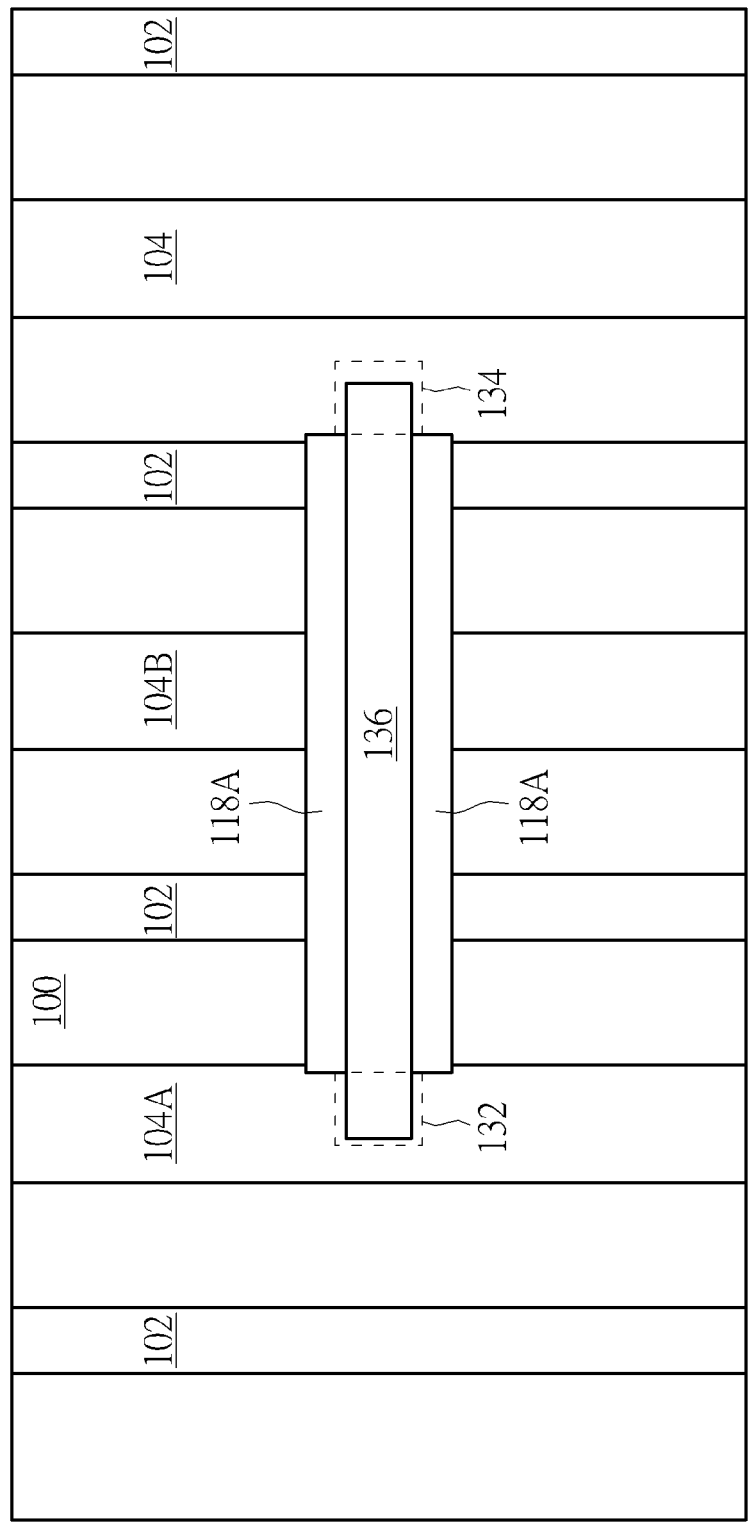

In FIG. 6, the portion of the conductive layer 126 filled in the first recess 122 is defined as a first contact region 132, and the portion of the conductive layer 126 filled in the second recess 124 is defined as a second contact region 134, in other words, both the first contact region 132 and the second contact region 134 belong to one part of the contact structure 126, the first contact region 132 directly contacts the first gate structure 104A, the second contact region 134 directly contacts the substrate 100 (or in another case, it may contact the STI), the hard mask 118A is disposed between the first contact region 132 and the second contact region 134. The portion of the conductive layer 126 filled in the recess 121 forms a bridged local interconnect 136, in other words, the bridged local interconnect 136 is a monolithically formed structure, and it crosses over parts of the hard mask 118A. Please refer to FIG. 6A, FIG. 6A shows the top view diagram of FIG. 6. In order to simplify the description, some elements are omitted in FIG. 6A, such as the S/D regions and the CESL. As shown in FIG. 6A, one terminal of the bridged local interconnect 136 (the first contact region 132) is disposed right above the first gate structure 104A, and another terminal of the bridged local interconnect 136 (the second contact region 134) is disposed on the substrate 100, and the hard mask 118A is only disposed within the region that between the first contact region 132 and the second contact region 134. The bridged local interconnect 136 across the second gate structure 104B, since the hard mask 118A and the CESL 116 is disposed between the bridged local interconnect 136 and the second gate structure 104B, the bridged local interconnect 136 will be electrically isolated from the second gate structure 104B.

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
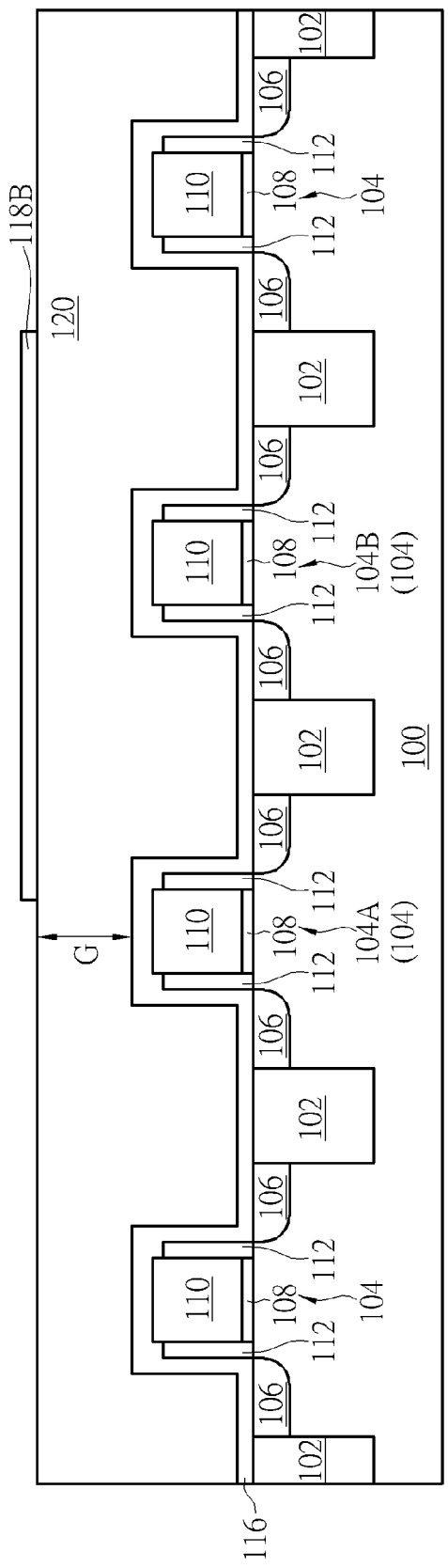

In the second preferred embodiment of the present invention, as shown in FIG. 7, after some elements including the first gate structure 104A, the second gate structure 104B, the spacers 112, the S/D regions 106, the CESL 116 are formed on the substrate 100, and before the hard mask 118 mentioned in the first preferred embodiment is formed, at this time, the dielectric layer 120 can be formed to cover the CESL 116. Next, a planarization process is performed to the dielectric layer 120, and a patterned hard mask 118B is then formed. When viewed in a top view (a projection view), the hard mask 118B is not disposed right above the first gate structure 104A, but it is disposed right above the second gate structure 104B, and the region that between the first gate structure 104A and the second gate structure 104B. Besides, in this embodiment, a gap G exists between a bottom surface of the hard mask 118B and a top surface of the CESL 116.

Figure 8:
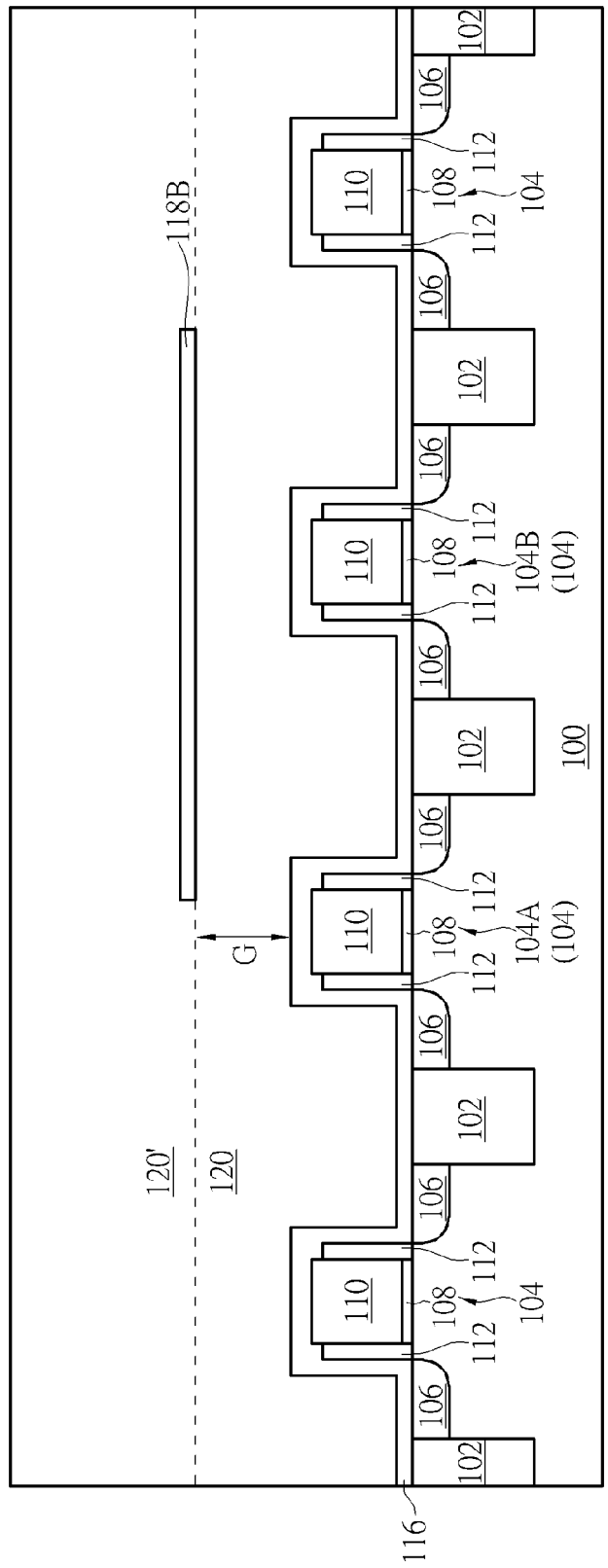
Figure 9:
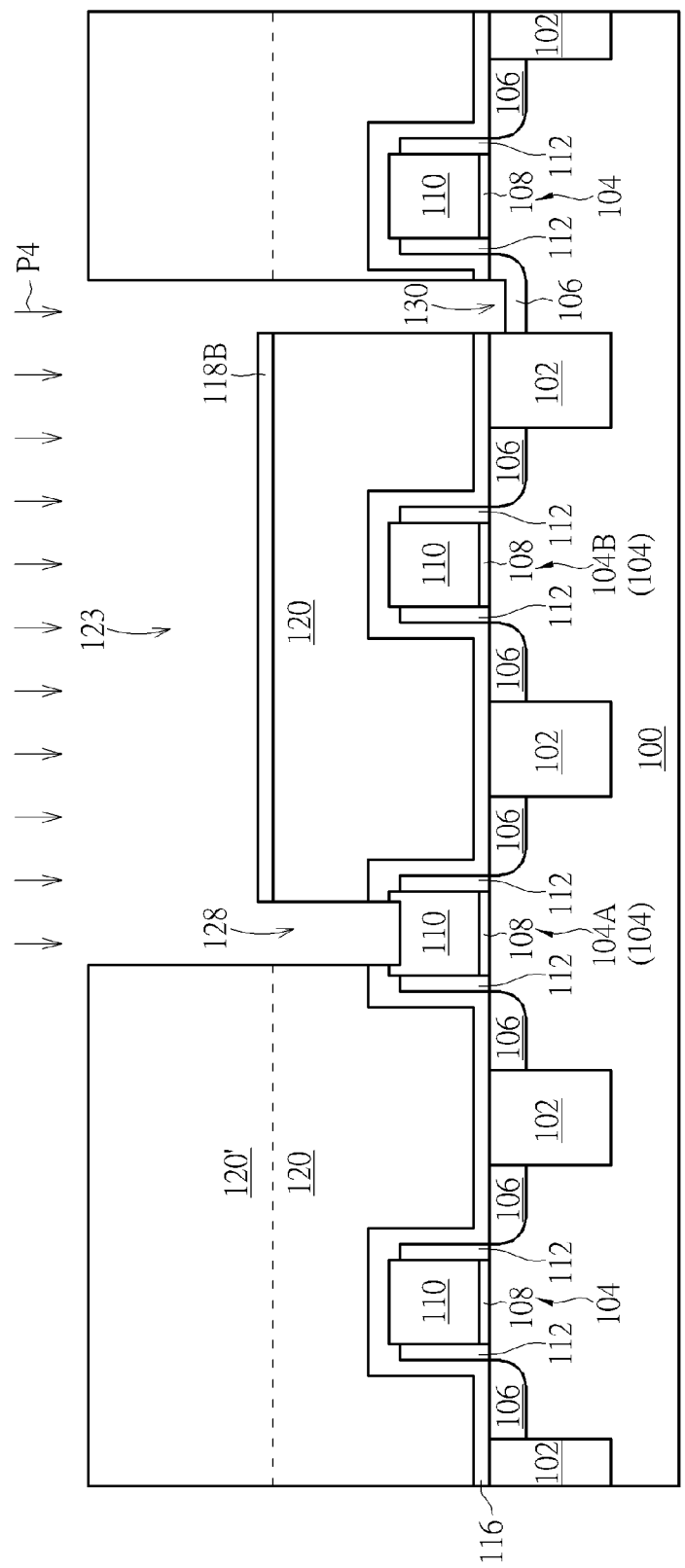

As shown in FIG. 8, another dielectric layer 120' is formed, covers the dielectric layer 120 and the hard mask 118B, the dielectric layer 120' preferably include the same material of the dielectric layer 120 (such as silicon oxide), but not limited thereto. Afterwards, as shown in FIG. 9, a fourth etching process P4 is performed, the fourth etching process P4 may include multiple steps etching processes, to remove parts of the dielectric layer 120, parts of the dielectric layer 120' and parts of the CESL 116, and so as to form a recess 123 in the dielectric layer 120' in the dielectric layer 120. Similarly, the recess 123 shown in FIG. 9 includes a first recess 128 and a second recess 130, the first recess 128 exposes a top surface of the first gate structure 104A, and the second recess 130 exposes the substrate 100 beside the second gate structure 104B. In another embodiment, the second recess 130 may also at least expose the STI 102 disposed beside the second gate structure 104B, it should also be within the scope of the present invention.

Figure 10:
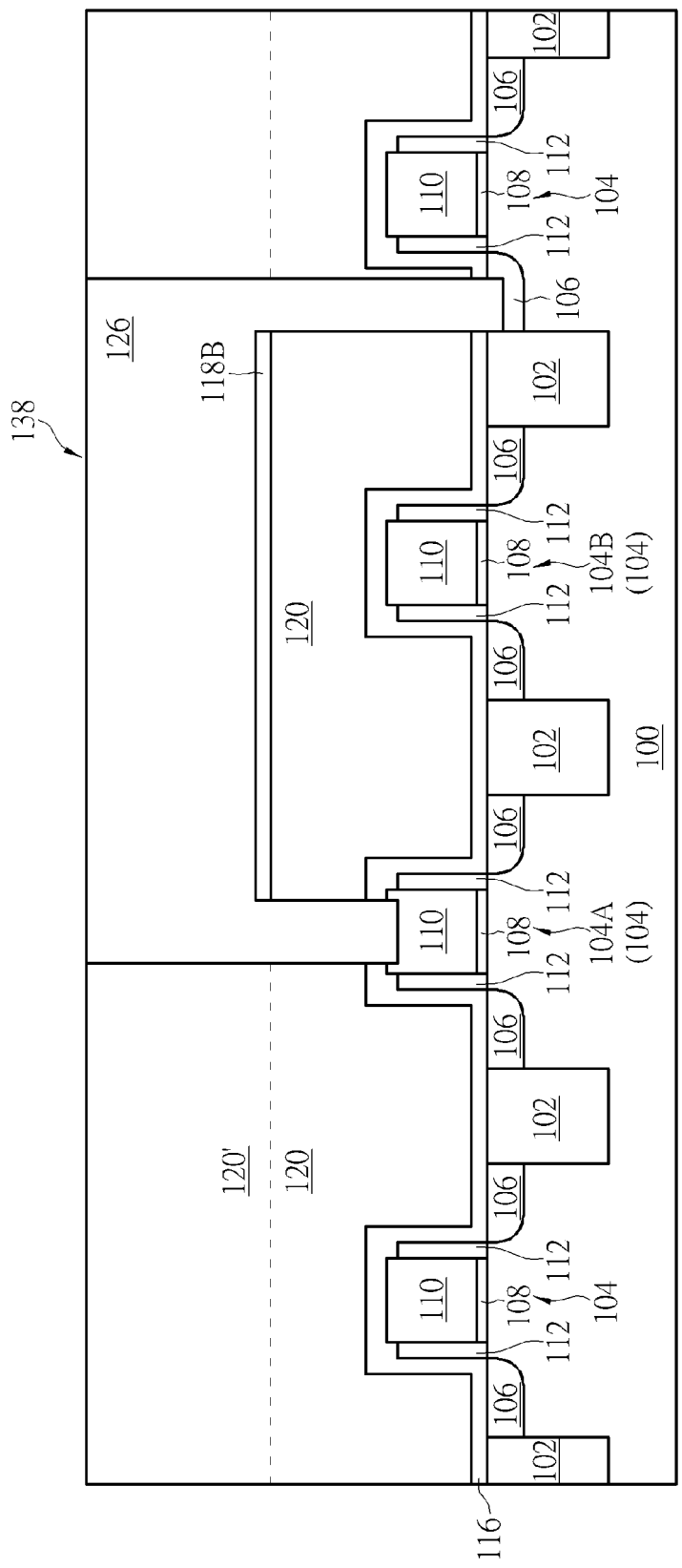

As shown in FIG. 10, a conductive layer 126 is formed in the recess 123, and a planarization process, such as a chemical mechanical polishing (CMP) is performed, to remove the extra conductive layer 126. Similar to the first preferred embodiment mentioned above, the portion of the conductive layer 126 filled in the recess 123 forms a bridged local interconnect 138, in other words, the bridged local interconnect 138 is a monolithically formed structure, across and above parts of the hard mask 118B. However, in this embodiment, the hard mask 118B does not comprise a battlements-shaped profile, but the hard mask 118B is a flat structure. In addition, a distance G exists between the hard mask 118B and the CESL 116.

Figure 11:
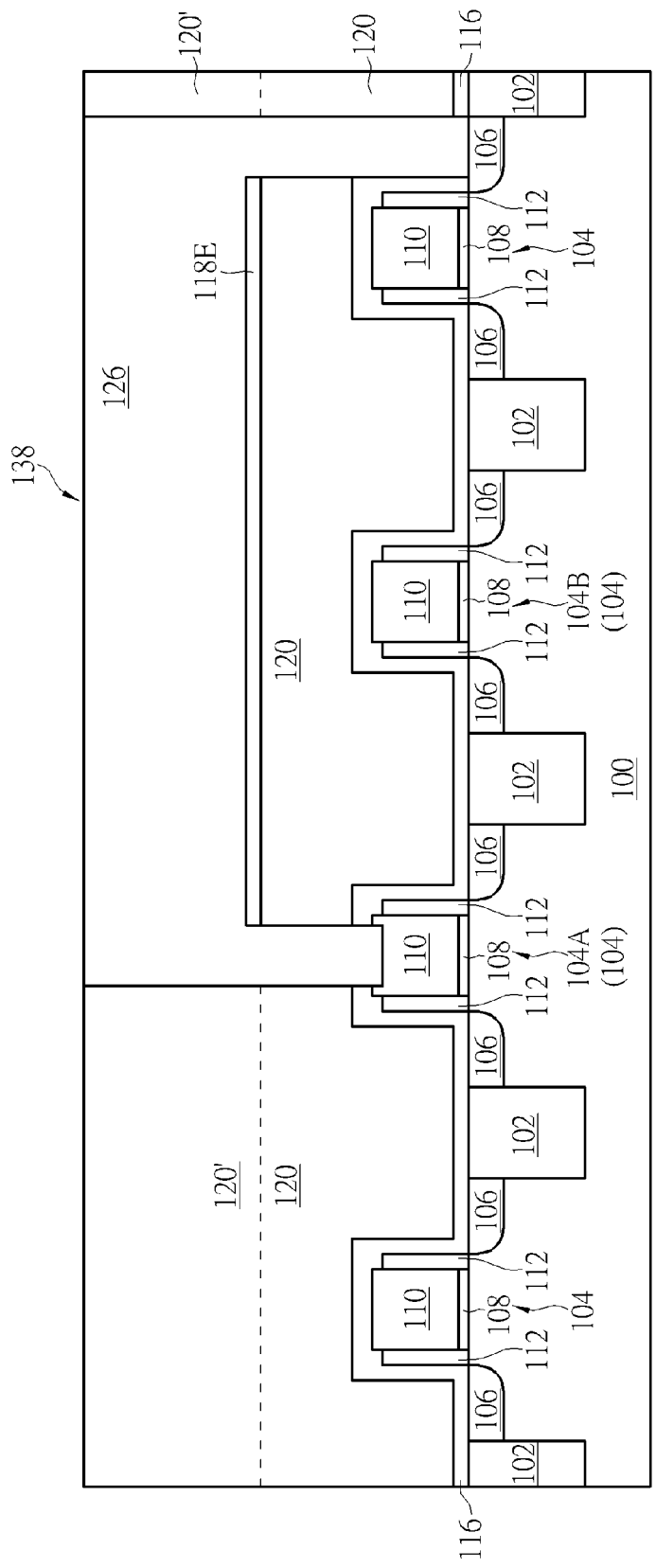
FIG. 11 shows the schematic diagram of the semiconductor structure according to another preferred embodiment of the present invention.

Furthermore, in those embodiments mentioned above, the bridged local interconnect 138 (or 136) crosses over one gate structure 104B, but in another embodiment of the present invention, as shown in FIG. 11, the bridged local interconnects 138 may cross over more than one gate structures 104, it should also be within the scope of the present invention.

Figure 12:
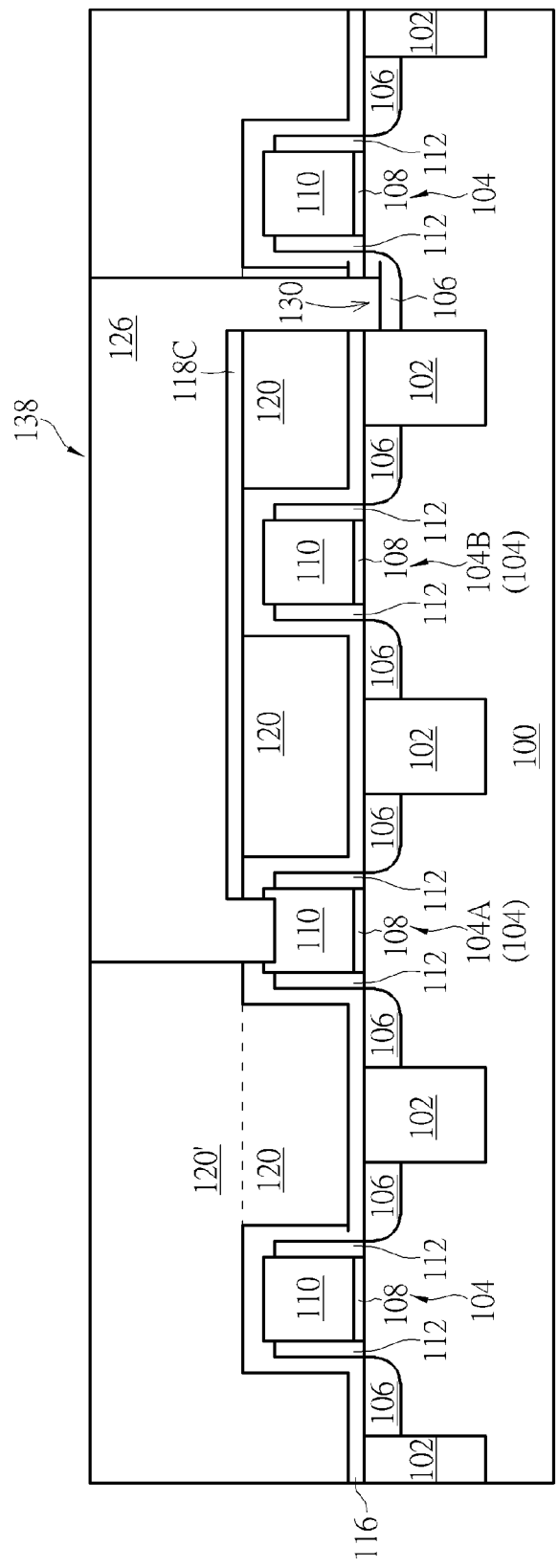
FIG. 12 shows the schematic diagram of the semiconductor structure according to another preferred embodiment of the present invention.

In further another case, as shown in FIG. 12, which shows the schematic diagram of the semiconductor structure according to another preferred embodiment of the present invention, the manufacturing processes of this embodiment are same as the manufacturing processes shown in the second preferred embodiment (please refer to FIG. 7-FIG.

Figure 13:
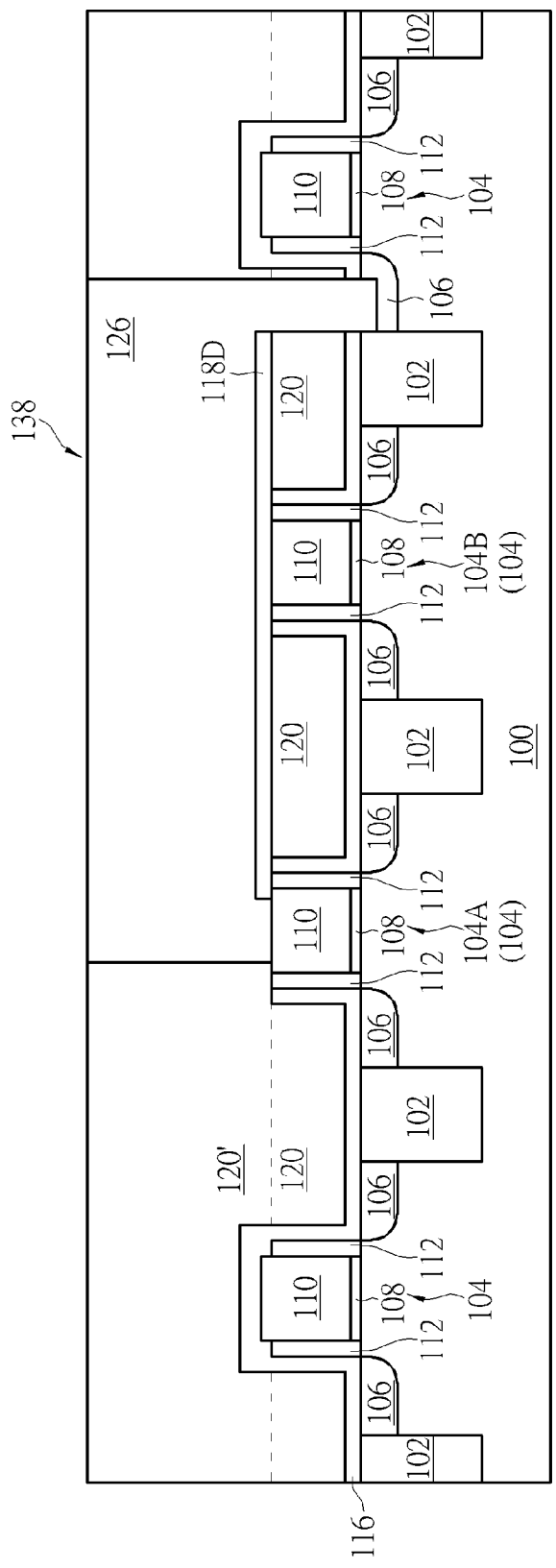
FIG. 13 shows the schematic diagram of the semiconductor structure according to another preferred embodiment of the present invention.

9), and the difference between these two embodiments is that: after the dielectric layer 120 is formed, a top surface of the CESL 116 has already exposed after the planarization process is performed. After a hard mask 118C is then formed, a bottom surface of the hard mask 118C and the top surface of the CESL 116 are on a same level, so the hard mask 118C is a flat structure too, and the hard mask 118C contacts the CESL 116 directly. In another embodiment of the present invention, please refer to FIG. 13, after the CESL 116 is formed, if the gate structure 104 is a polysilicon gate, a replacement metal gate (RMG) process can be selectively performed, which at least includes performing a planarization process, to expose the top, portion of the gate structure 104, and polysilicon gate is replaced by the metal gate. Next, a hard mask 118D is then formed, so a bottom surface of the hard mask 118D and the top surface of the gate structure 104 are on a same level. It should also be within the scope of the present invention.

A key feature of the present invention is that one terminal of the bridged local interconnect is electrically contacted to a specific gate structure, and the bridged local interconnect crosses over at least one adjacent device, and another terminal of the bridged local interconnect is electrically contacted to other devices. In practice, the bridged local interconnect can electrically contact to some adjacent devices, and it can be electrically isolated with other adjacent devices. So the bridged local interconnect of the present invention can applied in various circuit layout patterns. Using the method provided by the present invention, the bridged local interconnects can be formed simply and with low cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a dielectric layer disposed on the substrate;
   a first gate structure and a second gate structure disposed in the dielectric layer;
   a hard mask disposed in the dielectric layer, and the hard mask covers a sidewall of the first gate structure, and covers the second gate structure; and
   a contact structure disposed in the dielectric layer, the contact structure at least crosses over the hard mask, and the contact structure comprises a first contact region and a second contact region, both the first contact region and the second contact region belong to one part of the contact structure, wherein the first contact region directly contacts the first gate structure, the second contact region directly contacts the substrate, and wherein the hard mask is only disposed within a region that is between the first contact region and the second contact region.

2. The semiconductor structure of claim 1, further comprising a contact etching stop layer (CESL), covering the sidewall of the first gate structure, and covering the second gate structure.

3. The semiconductor structure of claim 2, wherein the hard mask directly contacts the CESL, and the hard mask has a battlements-shaped profile.

4. The semiconductor structure of claim 2, wherein the hard mask directly contacts the CESL, and the hard mask is a flat structure.

5. The semiconductor structure of claim 2, wherein the hard mask does not directly contact the CESL, and the hard mask is a flat structure.

6. The semiconductor structure of claim 1, further comprising a plurality of shallow trench isolations (STIs), disposed on two sides of the first gate structure and the second gate structure respectively.

7. The semiconductor structure of claim 6, wherein at least one STI of the plurality of the STIs is disposed between the second contact region and the second gate structure.

8. The semiconductor structure of claim 1, wherein the contact structure is a monolithically formed structure.

9. The semiconductor structure of claim 1, further comprising at least one S/D region disposed in the substrate beside the first gate structure and beside the second gate structure.

10. A method for forming a semiconductor structure, comprising:
    providing a substrate;
    forming a dielectric layer on the substrate;
    forming a first gate structure and a second gate structure on the dielectric layer;
    forming a hard mask in the dielectric layer, covering the first gate structure and the second gate structure;
    performing a first etching process, to remove parts of the hard mask, wherein after the first etching process is performed, the hard mask covers a sidewall of the first gate structure, and covers the second gate structure; and
    forming a contact structure in the dielectric layer, the contact structure at least crosses over the hard mask, and the contact structure comprises a first contact region and a second contact region, both the first contact region and the second contact region belong to one part of the contact structure, wherein the first contact region directly contacts the first gate structure, the second contact region directly contacts the substrate, and wherein the hard mask is only disposed within a region that is between the first contact region and the second contact region.

11. The method of claim 10, further comprising forming a contact etching stop layer (CESL), the CESL covers parts of the sidewall of the first gate structure, and covers the second gate structure.

12. The method of claim 11, wherein the hard mask directly contacts the CESL, and the hard mask has a battlements-shaped profile.

13. The method of claim 11, wherein the hard mask directly contacts the CESL, and the hard mask is a flat structure.

14. The method of claim 11, wherein the hard mask does not directly contact the CESL, and the hard mask is a flat structure.

15. The method of claim 10, further comprising forming a plurality of shallow trench isolations (STIs) on two sides of the first gate structure and the second gate structure respectively.

16. The method of claim 15, wherein at least one STI of the plurality of the STIs is disposed between the second contact region and the second gate structure.

17. The method of claim 10, wherein the contact structure is a monolithically formed structure.

18. The method of claim 10, further comprising forming at least one S/D region in the substrate beside the first gate structure and beside the second gate structure.

19. A semiconductor structure, comprising:
    a substrate;
    a dielectric layer disposed on the substrate;

a first gate structure and a second gate structure disposed in the dielectric layer;

a plurality of shallow trench isolations (STIs), disposed on two sides of the first gate structure and the second gate structure respectively;

a hard mask disposed in the dielectric layer, and the hard mask covers a sidewall of the first gate structure, and covers the second gate structure; and a contact structure disposed in the dielectric layer, the contact structure at least crosses over the hard mask, and the contact structure comprises a first contact region and a second contact region, both the first contact region and the second contact region belong to one part of the contact structure, wherein the first contact region directly contacts the first gate structure, the second contact region directly contacts the substrate, and wherein at least one STI of the plurality of the STIs is disposed between the second contact region and the second gate structure.

* * * * *